(12) United States Patent
Kobayashi

(10) Patent No.: US 11,613,067 B2
(45) Date of Patent: Mar. 28, 2023

(54) IMPRINT APPARATUS AND CONTROL METHOD OF IMPRINT APPARATUS

(71) Applicant: CANON KABUSHIKI KAISHA, Tokyo (JP)

(72) Inventor: Kenichi Kobayashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/089,981

(22) Filed: Nov. 5, 2020

(65) Prior Publication Data
US 2021/0138716 A1  May 13, 2021

(30) Foreign Application Priority Data
Nov. 12, 2019 (JP) .............. JP2019-204776

(51) Int. Cl.
*B29C 59/02* (2006.01)
*G03F 7/00* (2006.01)
*B29C 59/00* (2006.01)

(52) U.S. Cl.
CPC .......... *B29C 59/022* (2013.01); *B29C 59/002* (2013.01); *G03F 7/0002* (2013.01); *B29C 2059/023* (2013.01)

(58) Field of Classification Search
None
See application file for complete search history.

(56) References Cited

U.S. PATENT DOCUMENTS

2013/0120485 A1* 5/2013 Kodama .............. G03F 7/0002
347/14
2014/0368568 A1* 12/2014 Kodama .............. B41J 25/003
347/16

FOREIGN PATENT DOCUMENTS

WO  2007/120537 A2  10/2007

* cited by examiner

*Primary Examiner* — Michael P. Rodriguez
(74) *Attorney, Agent, or Firm* — Venable LLP

(57) ABSTRACT

An imprint apparatus includes an ejection device which ejects ejection material and a substrate stage which moves a substrate in a first direction and a second direction intersecting with the first direction. The imprint apparatus causes the ejection device to eject ejection material to the substrate while moving the substrate stage. At the time of ejecting ejection material to a second field adjacent to a first field in succession to an ejection to the first field in the first direction, the ejection device accepts an ejection start signal for the second field and determines an ejection start timing in the second field before ejection operation in the first field is completed.

15 Claims, 9 Drawing Sheets

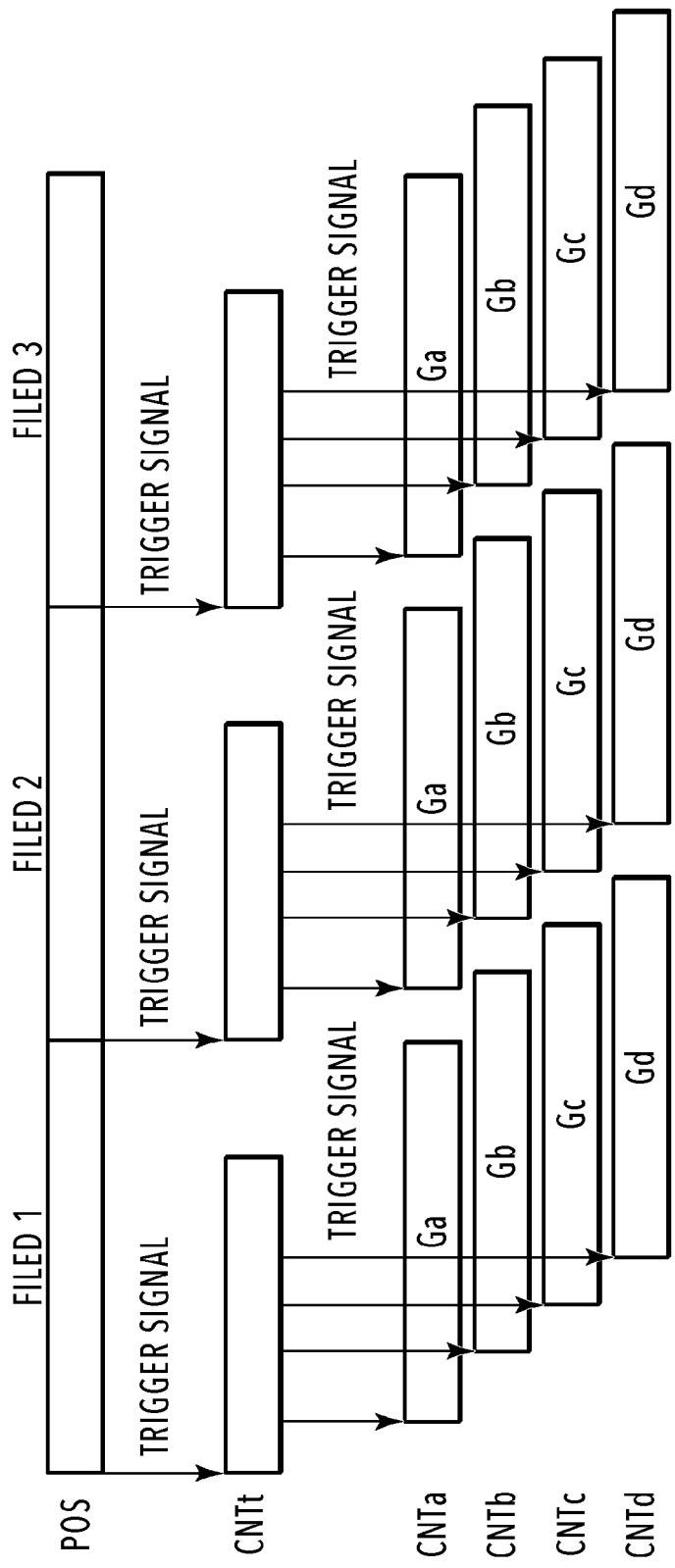

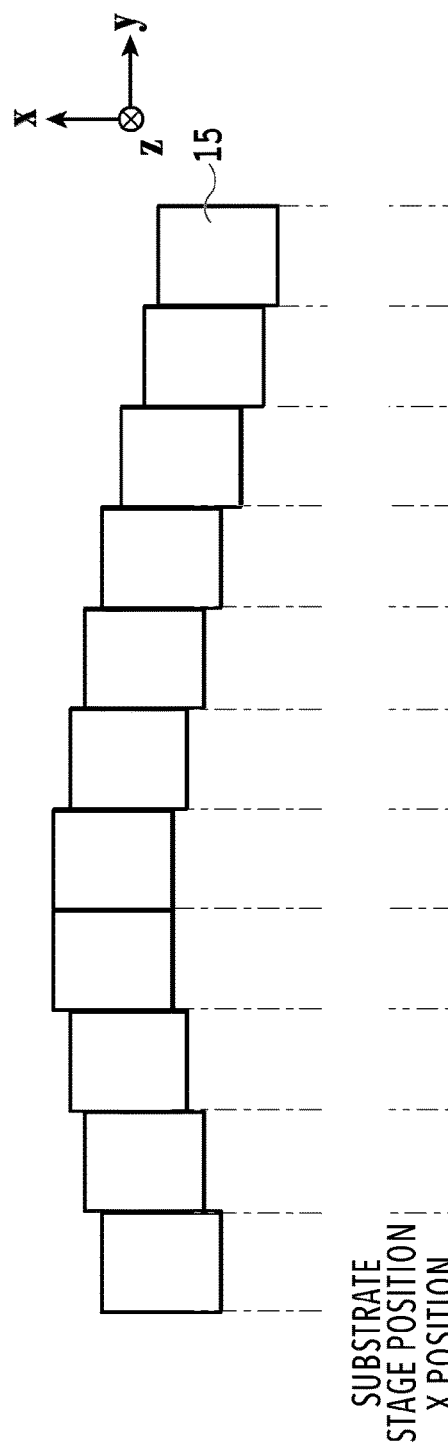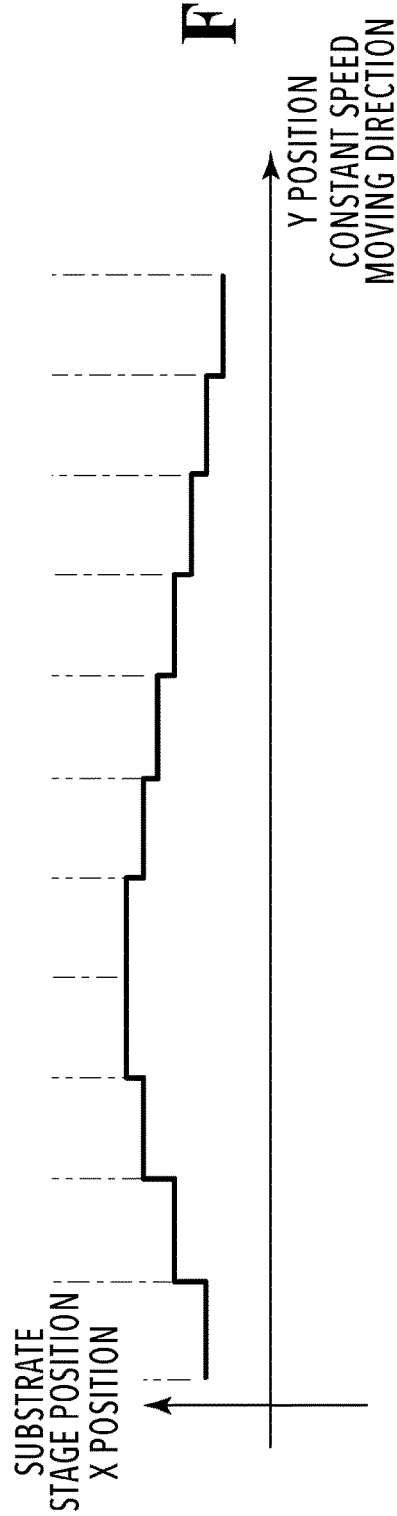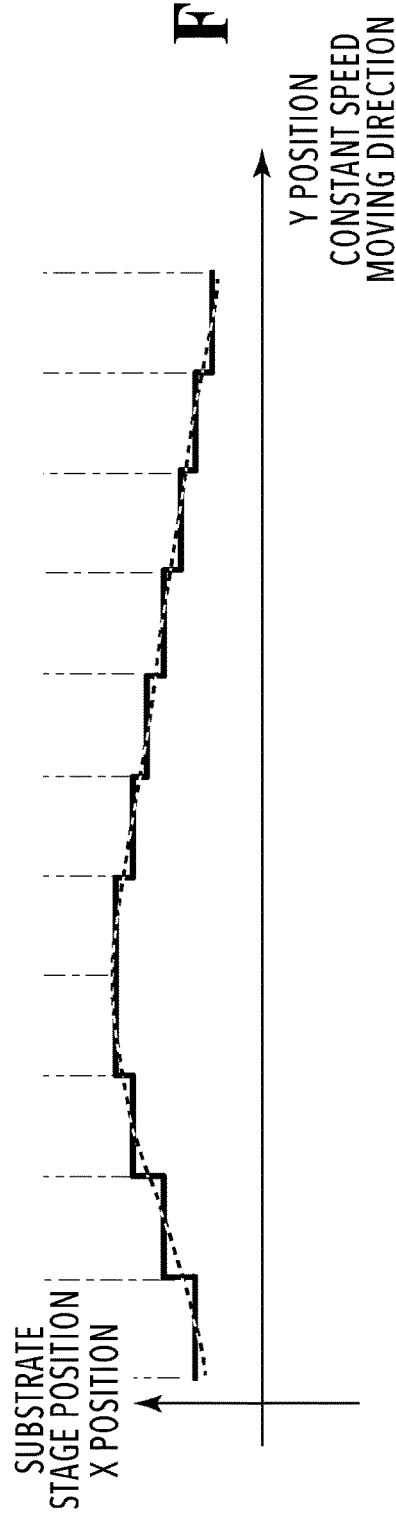

IMPRINT APPARATUS AND CONTROL METHOD OF IMPRINT APPARATUS

BACKGROUND OF THE INVENTION

Field of the Invention

The present invention relates to an imprint apparatus and a control method of the imprint apparatus.

Description of the Related Art

Imprinting is known as a technique to form a resin pattern on a substrate by molding an uncured resin on the substrate. In imprinting, a fine structure of several nanometers can be formed on a substrate. An imprint apparatus using a photo-curing method forms a pattern as follows. First, ejection material (such as imprint material or photo-curable resin) is ejected to a field that is an imprint area on a substrate. Next, a mold is pressed against the ejection material on the substrate. After that, the ejection material is cured by irradiation with ultraviolet rays and the mold is then removed, whereby a pattern is formed by the cured ejection material on the substrate.

Such an imprint apparatus uses an inkjet type ejection device to eject the ejection material on the substrate. During ejection operation, ejection is performed for an imprint target area while moving the substrate at a constant speed. In the imprint apparatus, the ejection operation and imprint operation are alternately repeated. International Publication No. WO 2007/120537 discloses a technique to reduce the number of substrate movements by performing ejection operation collectively for a plurality of fields.

However, in a case where a nozzle array width of the ejection device is greater than an interval between adjacent fields, ejection cannot be continuously performed for a plurality of fields including the adjacent fields. This results in a reduction in throughput of ejection operation.

SUMMARY OF THE INVENTION

An imprint apparatus according to an aspect of the present invention includes an ejection device which ejects ejection material and a substrate stage which moves a substrate in a first direction and a second direction intersecting with the first direction. The imprint apparatus causes the ejection device to eject ejection material to a plurality of fields on the substrate while moving the substrate stage. At the time of ejecting ejection material to a second field adjacent to a first field in succession to an ejection to the first field in the first direction, the ejection device accepts an ejection start signal for the second field and determines an ejection start timing in the second field before ejection operation in the first field is completed.

Further features of the present invention will become apparent from the following description of exemplary embodiments with reference to the attached drawings.

BRIEF DESCRIPTION OF THE DRAWINGS

FIG. 6 is a diagram showing ejection control timings;

FIGS. 8A to 8C are diagrams showing an example of correcting the position of a substrate stage.

DESCRIPTION OF THE EMBODIMENTS

Figure 1:
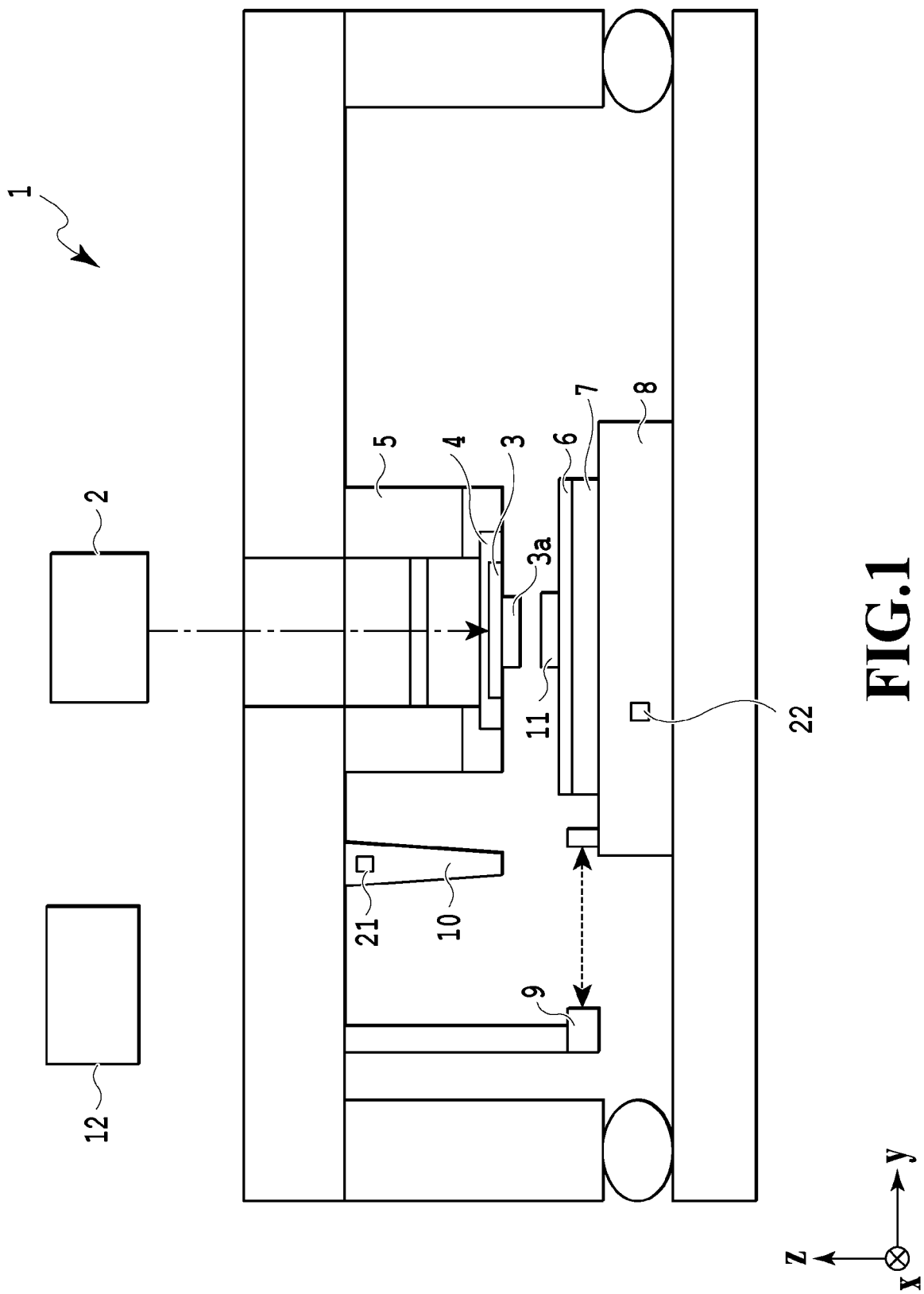
FIG. 1 is a diagram showing a configuration of an imprint apparatus.

Embodiments will be described below with reference to the drawings. The same reference numeral is assigned to the same feature. It should be noted that the relative arrangement, shapes, and the like of constituent elements described in the embodiments are merely shown as an example.

First Embodiment

<Configuration of Imprint Apparatus>

FIG. 1 is a diagram showing a configuration of an imprint apparatus 1 of the present embodiment. The configuration of the imprint apparatus 1 will be described with reference to FIG. 1.

The imprint apparatus 1 is an apparatus that presses a mold 3 against ejection material 11 supplied on a substrate 6 and provides the ejection material 11 with energy for curing, thereby forming a pattern of cured material to which an uneven pattern 3a on the mold 3 is transferred. The imprint apparatus 1 is used to manufacture a device such as a semiconductor device as an article. The ejection material 11 is also referred to as imprint material, resin, or application material. The description will be given of an imprint apparatus using photo-curable resin material as the ejection material 11.

The imprint apparatus 1 comprises a mold holding portion 4 for holding the mold 3 and a mold driving mechanism 5 which vertically moves the mold 3 to press it against the substrate 6. The imprint apparatus 1 also comprises a substrate holding portion 7 for holding the substrate 6 and a substrate stage 8 movable in horizontal directions including at least an x-direction, a y-direction, and a rotation direction on the xy-plane. The positioning of the substrate stage 8 is controlled by the use of a displacement sensor 9 of an interferometer system that is generally used for a positioning table. Alternatively, a linear encoder may be used instead of the displacement sensor 9.

The ejection device 10 ejects the ejection material 11 for pattern formation to an area on the substrate 6 having the same size as the uneven pattern 3a. During ejection operation, ejection is performed while moving the substrate stage 8 at a constant speed. A light source 2 is also provided for photo-curing of the ejection material 11. A UV light source of 400 nm or less is generally used as the light source 2.

The mold driving mechanism 5, the substrate stage 8, the ejection device 10, and the light source 2 are controlled by a control unit 12. The control unit 12 may include a plurality of controllers (not shown). The substrate stage 8 comprises a stage control unit 22. The stage control unit 22 controls the substrate stage 8 under instructions from the control unit 12. The ejection device 10 comprises an ejection control unit 21.

The ejection control unit 21 controls the ejection device 10 under instructions from the control unit 12 and the stage control unit 22.

<Description of Ejection Operation>

FIGS. 2A to 2D are diagrams showing ejection operation by the ejection device 10. A dashed line in FIGS. 2A to 2D indicates an imprint position by the mold 3. FIGS. 2A to 2D show an example in which the ejection device 10 performs ejection while the substrate stage 8 is moved in a stage moving direction (y-direction in this example), whereby the ejection material 11 is ejected to a predetermined field (ejection area). During ejection operation, the position of the ejection device 10 is not changed, whereas the position of the substrate stage 8 is changed. The position of the ejection device may be changed with respect to the substrate instead of changing the position of the substrate with respect to the ejection device. That is, any moving mechanism may be used as long as it moves one of the substrate and the ejection device relative to the other.

Figure 2A:
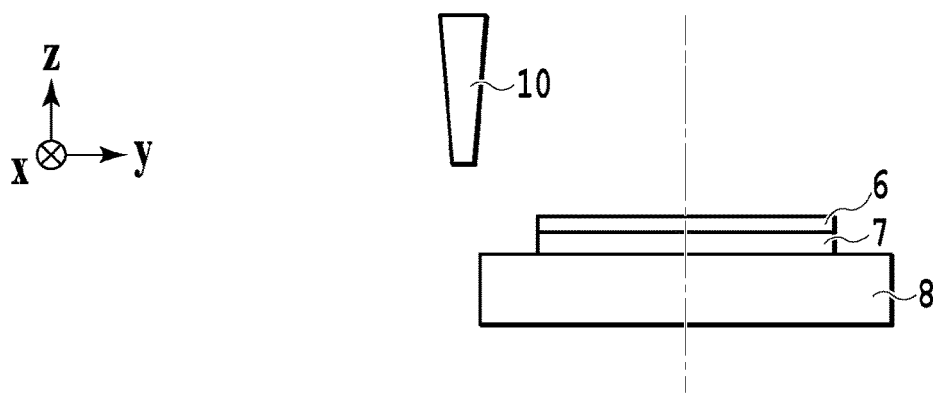
FIGS. 2A to 2D are diagrams showing ejection operation.
Figure 2B:
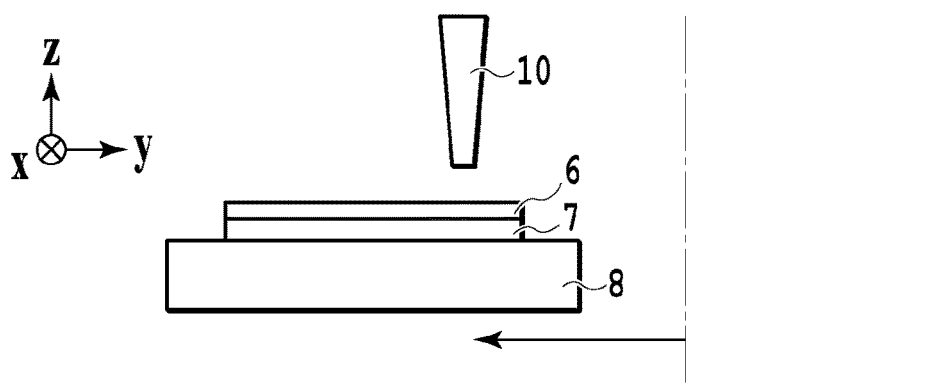
Figure 2C:
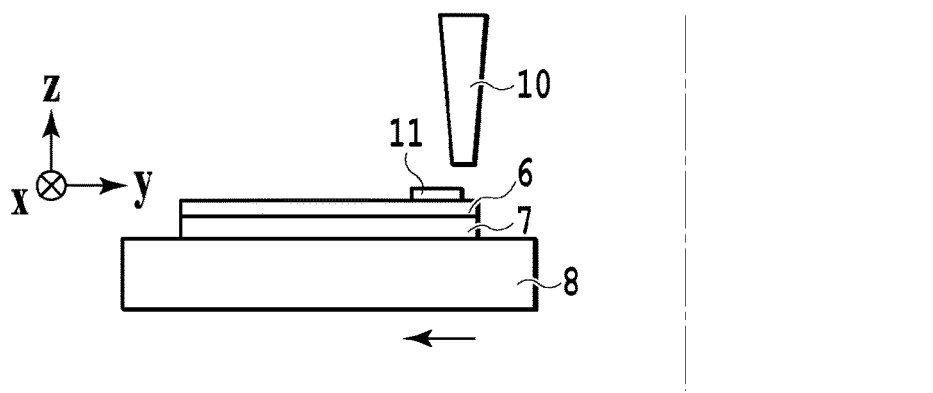

FIG. 2A shows the positions of the ejection device 10 and the substrate stage 8 at the start of the ejection operation. FIG. 2B shows a state in which the substrate stage 8 has been moved at a constant speed such that an ejection start position in the ejection area on the substrate 6 is under the ejection device 10 in the direction of gravity. At the timing of FIG. 2B, the ejection device 10 starts ejection. The substrate stage 8 continues moving while keeping the constant speed. After reaching an ejection completion position shown in FIG. 2C, the substrate stage 8 starts reducing the speed to stop. On the other hand, the ejection device 10 completes the ejection operation. The ejection operation for the ejection area is thus completed.

Figure 2D:
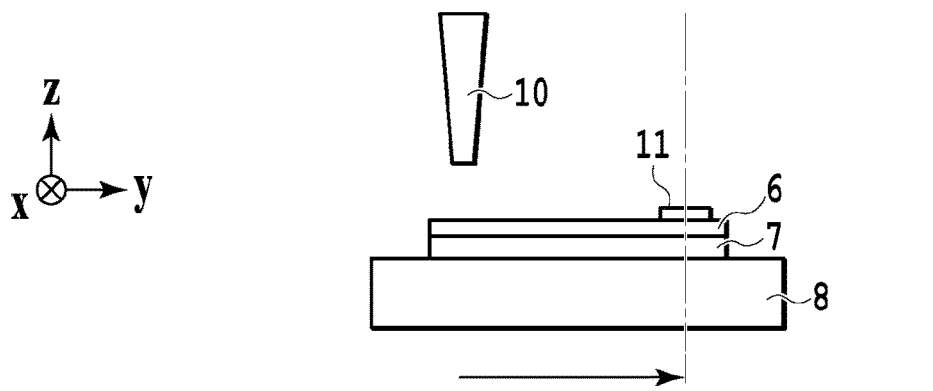

Next, for imprint operation, the substrate stage 8 is returned such that the position of the ejection area corresponds to the imprint position as shown in FIG. 2D. At this time, the ejection material 11 can be ejected at higher density by performing the ejection operation also in the return path.

After that, the mold 3 (not shown in FIGS. 2A to 2D) is lowered and thereby pressed against the ejection area of the substrate 6. The ejection area is then irradiated using the light source 2 to cure the ejection material 11. After curing, the mold 3 is raised and the pattern formation is completed. In a case where the pattern is formed on the entire substrate 6, the ejection operation and the imprint operation are repeatedly performed. For convenience of explanation, FIGS. 2A to 2D show an example in which the ejection operation is performed for one field (ejection area, imprint area) and the imprint operation is performed for that field. In the present embodiment, the imprint operation is performed continuously after the execution of continuous ejection operation for a plurality of fields, as will be described later.

FIGS. 3A to 3F are diagrams showing a nozzle layout of the ejection device 10 and ejection operation for each nozzle array. The ejection device 10 comprises an inkjet type ejection head 13. The ejection head 13 ejects the ejection material 11 to the substrate 6.

Figure 3A:
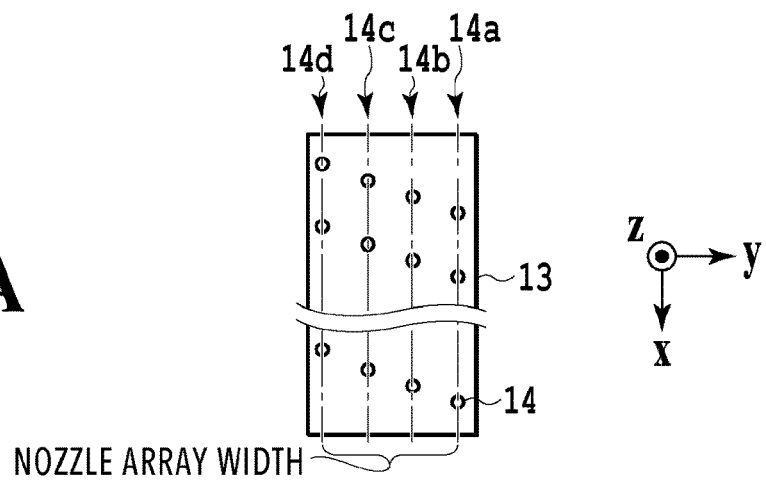
FIGS. 3A to 3F are diagrams showing a nozzle layout in an ejection device and ejection operation for each nozzle array.
Figure 3B:
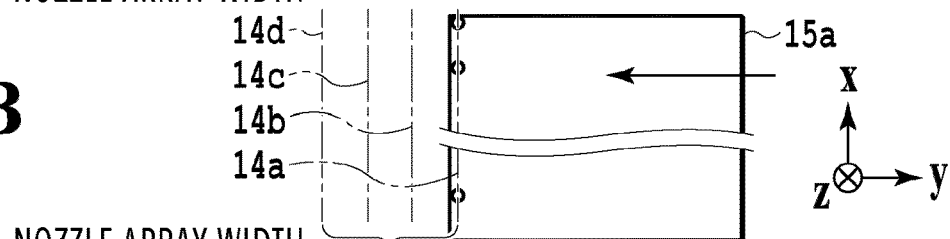
Figure 3C:
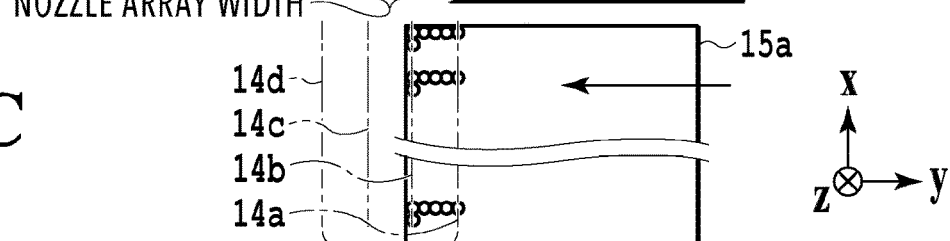
Figure 3D:
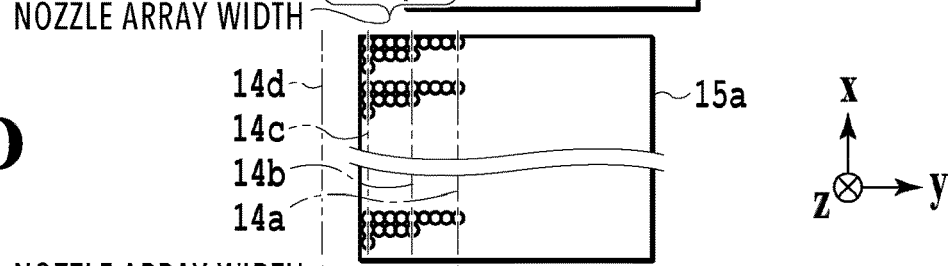
Figure 3E:
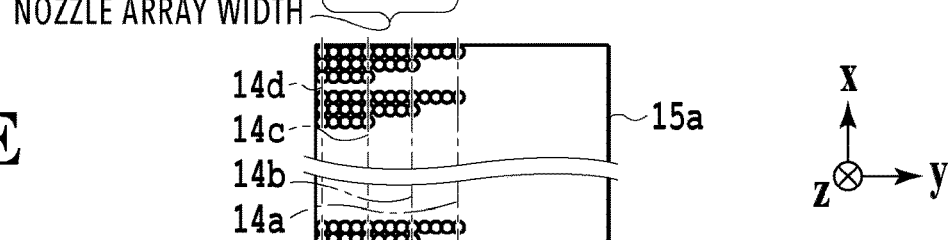

FIG. 3A shows a nozzle surface of the ejection head 13. On the nozzle surface of the ejection head 13, nozzles 14 are provided at regular intervals in a direction (x-direction) orthogonal to a constant speed moving direction (y-direction) of the substrate stage 8. The intervals between the nozzles 14 are restricted by nozzle diameter and processing technique. In the present embodiment, a plurality of nozzle arrays are arranged in the constant speed moving direction (y-direction) of the substrate stage 8 such that the ejection material 11 can be ejected at higher density. In the example of FIGS. 3A to 3F, four nozzle arrays 14a to 14d are arranged. The nozzle arrays are displaced in the orthogonal direction (x-direction) of the constant speed moving direction (y-direction). Thus, the imprint apparatus 1 uses the ejection head 13 comprising a plurality of nozzle arrays, whose nozzles are provided in positions not overlapping in the direction orthogonal to the stage moving direction.

FIGS. 3B to 3F show ejection of the ejection material 11 to a field 15a on the substrate 6 in chronological order. In this example, the ejection is started from the nozzles of the nozzle array 14a. After that, in accordance with the movement of the substrate stage 8 (not shown in FIGS. 3A to 3F), the ejection to the field 15a is performed from the nozzles of the nozzle arrays 14b, 14c, and 14d. As shown in FIGS. 3B to 3F, ejection can be performed at high density in a line in the ejection area by changing ejection timings for each of the nozzle arrays 14a to 14d. In this manner, in the imprint apparatus 1, ejection operation in a predetermined area in the stage moving direction in the field is completed by ejection from a plurality of nozzle arrays.

Figure 3F:
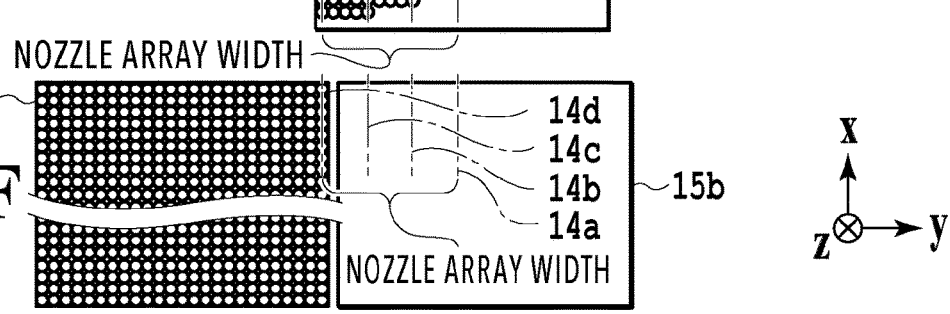

As shown in FIG. 3F, at the time of completion of ejection to the field 15a of the substrate 6, the position of the nozzle array 14a, which performed ejection first, on the substrate 6 is beyond the ejection start position of a field 15b adjacent to the field 15a. That is, even if ejection is performed in the state shown in FIG. 3F, ejection corresponding to a nozzle array width between the nozzle array 14a and the nozzle array 14d cannot be performed at least in the nozzle array 14a. This will be described below using a comparative example of FIG. 4.

<Description of Comparative Example>

Figure 4:
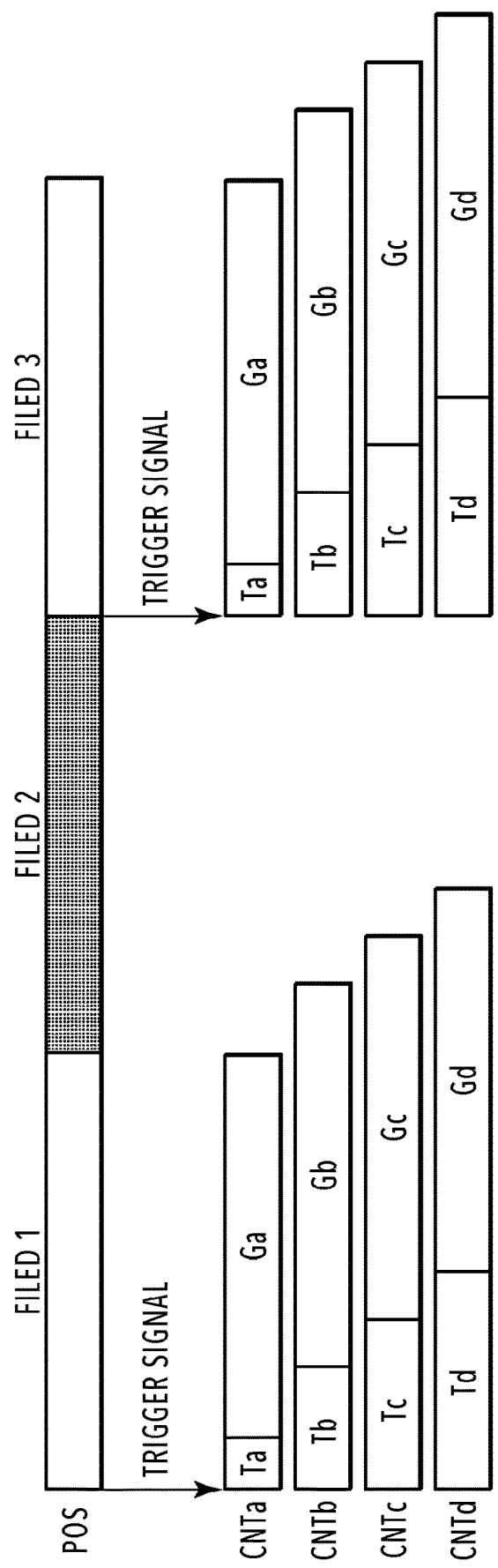
FIG. 4 is a diagram showing ejection control timings in a comparative example.

FIG. 4 is a diagram showing ejection control timings in a comparative example different from the present embodiment. The description of the comparative example with reference to FIG. 4 will be followed by the description of the example of the present embodiment. At the time of reaching the ejection area, the stage control unit 22 of the substrate stage 8 outputs a trigger signal for causing the ejection control unit 21 of the ejection device 10 to start ejection. The ejection control unit 21 of the ejection device 10 determines an ejection start time (Ta to Td) of each nozzle array from the interval of each nozzle array and the moving speed of the substrate stage 8 with respect to the time of receipt of the trigger signal. Nozzle array control units CNTa to CNTd of the respective nozzle arrays constituting the ejection control unit 21 start ejection control (Ga to Gd) at the ejection start times (Ta to Td).

In the ejection control (Ga to Gd), ejection is performed a designated number of times at periodic intervals based on ejection pattern information indicating an ejection pattern to be ejected to the ejection area. The ejection pattern information includes information about the presence/absence of ejection per ejection period. The nozzle array control units CNTa to CNTd determine the presence/absence of ejection for each ejection period and output a drive signal for ejecting the ejection material 11 to the nozzles 14.

The ejection control unit 21 of the ejection device 10 cannot receive a trigger signal for ejection to the next field until the ejection control Gd in the last nozzle array is completed. This is because if the trigger signal is received in the midstream of the ejection control Gd, ejection control for the next field is started before the ejection control Gd is completed. Thus, the comparative example requires a waiting time from the completion of the ejection control Ga to the completion of the ejection control Gd. The waiting time is determined by the nozzle array width (see FIGS. 3A to 3F) between the nozzle arrays 14a and 14d at both ends and the moving speed of the substrate stage 8. In the case of continuous ejection to a plurality of fields, at least an interval corresponding to the nozzle array width between both ends needs to be provided between the fields.

Figure 5A:
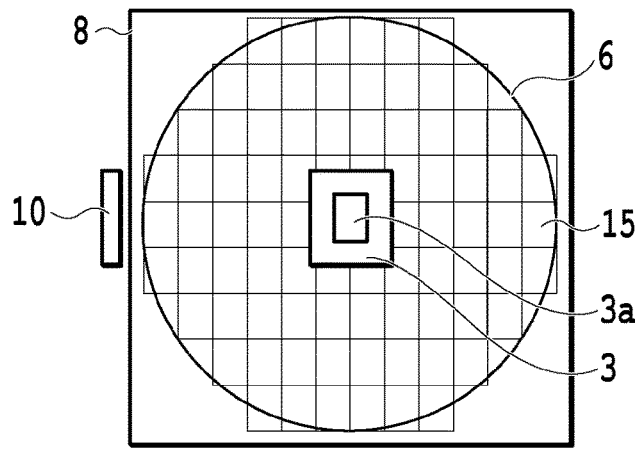
FIGS. 5A to 5C are diagrams showing continuous ejection operation for a plurality of fields in the comparative example.
Figure 5B:
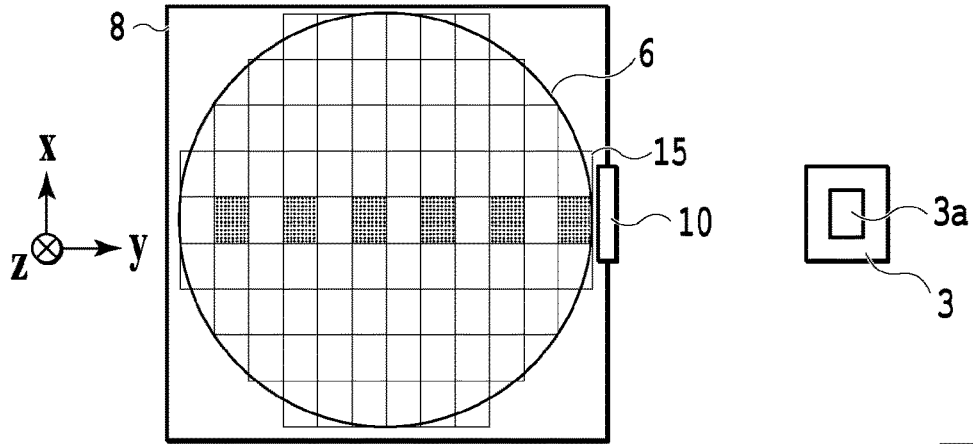
Figure 5C:
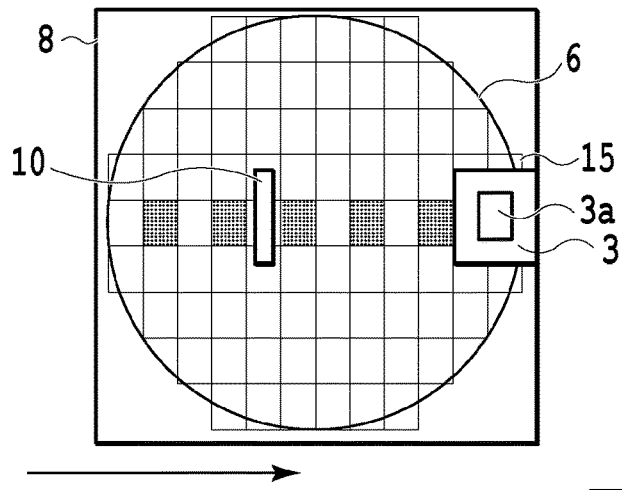

FIGS. 5A to 5C are diagrams showing continuous ejection operation for a plurality of fields in the comparative example of FIG. 4. FIGS. 5A to 5C show that the positions of the uneven pattern 3a on the mold 3 and the ejection device 10 are fixed and the position of the substrate 6 is moved by moving the substrate stage 8. The time-series transition is shown in the order from FIG. 5A to FIG. 5C.

FIG. 5A shows a state in which the center coordinates of the substrate stage 8 are in the imprint position. In other words, the center coordinates of the substrate 6 are located in a position corresponding to the uneven pattern 3a of the mold 3. The substrate stage 8 is driven at a constant speed toward the ejection device 10 and the ejection device 10 performs ejection operation, thereby performing continuous ejection operation corresponding to one line shown in FIG. 5B. After that, the substrate stage 8 is moved to the imprint position shown in FIG. 5C and the imprint operation is sequentially performed for the ejection areas.

In the ejection device 10 of the present embodiment, the nozzle array width between both ends is about 5 mm, whereas the interval between adjacent fields is only several micrometers. Accordingly, continuous ejection to adjacent fields cannot be performed as shown in FIGS. 4 and 5A to 5C. It is necessary to perform ejection at least for alternate fields. FIGS. 5A to 5C show an example in which ejection has been performed for alternate fields. After the completion of continuous ejection for alternate fields corresponding to one line, the substrate stage 8 is moved to the imprint position and the imprint operation is performed. After the completion of the imprint operation for the first field 15, the imprint operation is sequentially performed for fields for which ejection has been performed. After the completion of the imprint operation for all the fields for which ejection has been performed, the imprint apparatus 1 performs ejection operation for fields in the same line for which ejection has not yet been performed and similarly performs the series of imprint operation. As described above, in the comparative example, it is necessary to perform the ejection operation at least twice for each line on the substrate 6.

In contrast, according to ejection control of the present embodiment described below, ejection can be continuously performed for a plurality of fields including adjacent fields.

<Description of Ejection Control>

FIG. 6 is a diagram showing ejection control timings in the present embodiment. As shown in FIG. 6, the ejection control unit 21 of the ejection device 10 comprises an ejection start timing control unit CNTt for collectively controlling ejection start timings of the nozzle arrays. The ejection start timing control unit CNTt is separate from and independent of the nozzle array control units CNTa to CNTd of the respective nozzle arrays.

At the time when the substrate stage 8 reaches the ejection start position, upon receipt of the trigger signal output from the stage control unit 22, the ejection start timing control unit CNTt determines an ejection start time of each nozzle array from the nozzle array interval and the moving speed of the substrate stage 8. At the determined time, the ejection start timing control unit CNTt outputs a trigger signal (ejection start command) to a control unit CNT of a corresponding nozzle array. At the timing of receiving the trigger signal, each of the nozzle array control units CNTa to CNTd performs ejection operation a designated number of times at periodic intervals.

As described above, each of the nozzle array control units CNTa to CMTd is independent of the ejection start timing control unit CNTt. Accordingly, for example, even if the ejection start timing control unit CNTt receives the trigger signal from the stage control unit 22 in the midstream of the ejection control Gd of the last nozzle array, the ejection control Gd of the last nozzle array is executed until it is completed. This is because at that timing, a trigger signal is not output from the ejection start timing control unit CNTt to the nozzle array control unit CMTd of the last nozzle array. In this manner, a trigger signal from the substrate stage 8 is accepted and ejection timings are suitably controlled even in a state where ejection of all nozzle arrays is not completed, whereby ejection can be continuously performed for a plurality of fields including adjacent fields.

In other words, the ejection start timing control unit CNTt accepts an ejection start signal of the N+1th field and determines an ejection start timing in the N+1th field before the completion of ejection operation in the Nth field among a plurality of fields on the substrate 6. N is a natural number. The N+1th field is located downstream of the Nth field in the stage moving direction. In the present embodiment, at the time of ejecting the ejection material to a second field adjacent to a first field in succession to the first field in a first direction, an ejection start signal for the second field is accepted before the completion of ejection operation in the first field. The ejection start timing control unit CNTt determines an ejection start timing in the second field.

Figure 7A:
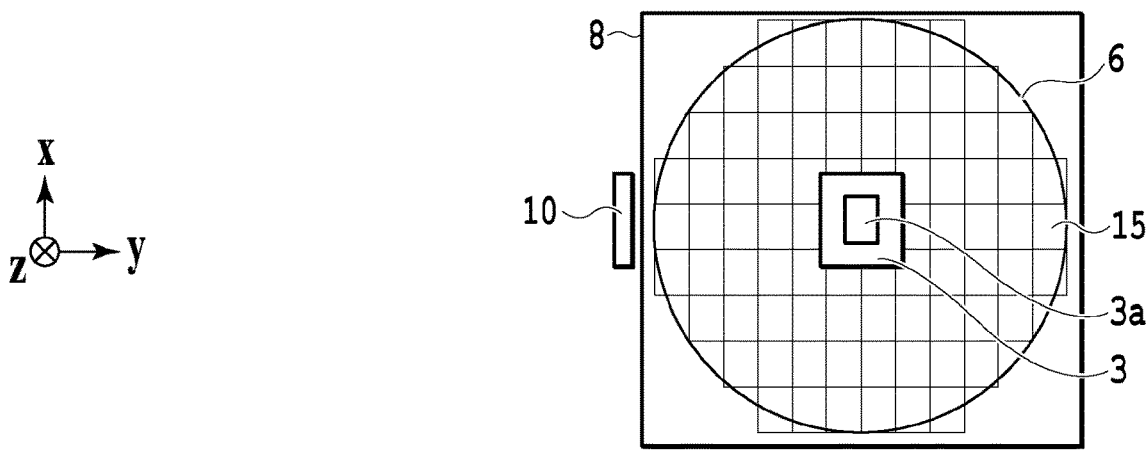
FIGS. 7A to 7C are diagrams showing operation in the case of continuous ejection to a plurality of fields.
Figure 7B:
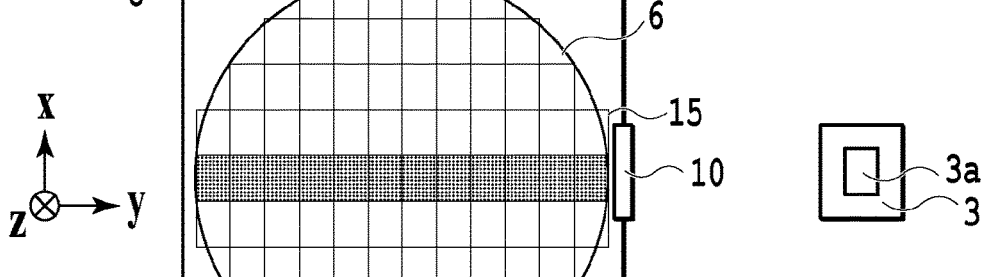
Figure 7C:
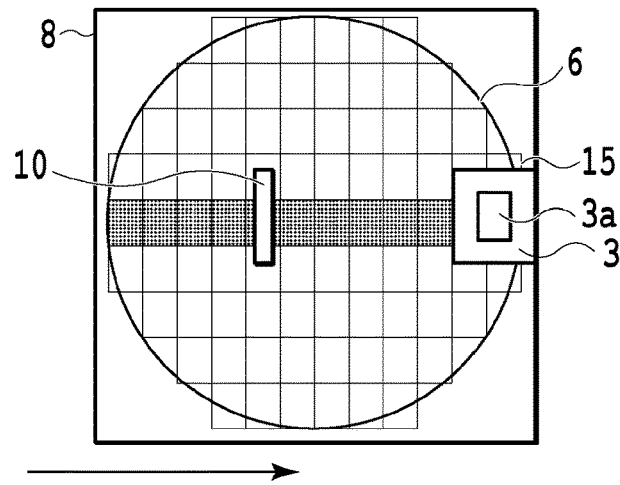

FIGS. 7A to 7C are diagrams showing operation in the case of continuous ejection to a plurality of fields in the imprint apparatus in the ejection control shown in FIG. 6. FIG. 7A shows a state in which the center coordinates of the substrate stage 8 are in the imprint position. The substrate stage 8 is driven at a constant speed toward the ejection device 10 and ejection operation corresponding to one line including adjacent fields is performed. After continuous ejection corresponding to one line is completed as shown in FIG. 7B, the substrate stage 8 is moved to the imprint position shown in FIG. 7C. The imprint operation is then performed. After the completion of imprint operation for the first field 15, imprint operation is sequentially performed for fields for which ejection has been performed. After the completion of imprinting for all the fields for which ejection has been performed, the ejection operation transitions to the next line in a direction intersecting with the moving direction. As described above, according to the processing of the present embodiment, since ejection can be continuously performed for fields of each line, ejection to fields corresponding to one line can be completed by performing ejection operation once. As a result, throughput can be improved as compared with the comparative example.

Second Embodiment

In the first embodiment, the description has been given of continuous ejection control in which ejection is continuously performed for a plurality of fields including adjacent fields. The description of the second embodiment will provide an example in which the substrate stage 8 is moved in the stage moving direction while correcting the position of the substrate stage 8 at the time of the continuous ejection control.

In the imprint apparatus 1, for high-precision ejection to fields, the substrate position in the orthogonal direction orthogonal to the moving direction of the substrate stage 8 and the rotation direction is adjusted for each field. As described in the first embodiment, in the case of continuous ejection to a plurality of fields including adjacent fields, there is a possibility that a time for step movement of the substrate 6 cannot be secured. In the present embodiment, the substrate stage 8 is moved at a constant speed in the stage moving direction while correcting the position of the substrate stage 8.

FIGS. 8A to 8C are diagrams showing an example of correcting the position of the substrate stage 8. FIG. 8A is a diagram showing the locus of operation of the substrate stage 8 at the time of continuous ejection to fields corresponding to one line on the substrate 6. In FIG. 8A, eleven fields 15 constitutes one line. Running errors of the substrate stage 8 are included in the orthogonal direction (x-direction in the drawings) of the constant speed moving direction of the substrate stage 8. Thus, the fields 15 are not in an ideal grid pattern. The running errors are caused by the processing accuracy of the substrate stage 8 guide, a linearity error of a position measurement sensor, or the like. In particular, since the imprint apparatus requires the ejection position accuracy in units of several micrometers, the running errors of the substrate stage 8 are not allowable.

The running errors of the substrate stage 8 can be measured and obtained in advance. For example, fluctuations of ejection positions can be detected through position measurements using a microscope (not shown) provided in the apparatus without imprinting the ejected ejection material 11. A running error X1 in each field can be calculated by obtaining the average value (X, Y) of the positions of the ejection material 11 ejected to the fields.

FIG. 8B shows an example of step movement of the substrate stage 8 on the occurrence of the running errors shown in FIG. 8A. As shown in FIG. 8B, an error in ejection position can be corrected by step movement of the substrate stage 8 in the x-direction so as to correct the running error X1 between fields. However, in the case of continuous ejection to adjacent fields, there is a possibility that a time for step movement cannot be secured. Further, depending on the amount of step movement, an overshoot or undershoot occurs and it takes time to attenuate vibration. In this case, there is a possibility of a decrease in ejection position accuracy of the front area of the next field.

In the present embodiment, as shown in FIG. 8C, in the case of correcting the position of the substrate stage 8, control is performed such that the position correction is performed even during the ejection operation for fields without performing control for movement only between the fields. More specifically, first, a correction amount X2 for each field is calculated. The correction amount X2 corresponds to a correction amount for correcting the running error X1. A continuous drive locus is generated by approximation interpolation of the correction amounts X2 of the respective fields. The position of the substrate stage 8 is corrected along the drive locus even during ejection operation, whereby the ejection operation can be continuously performed while correcting the position even between adjacent fields.

Although only the correction in the x-direction has been described in the example of FIG. 8, rotation correction can be similarly performed in the rotation direction. For example, a rotation correction amount can be calculated from the respective positions of the ejection material 11 measured by the microscope (not shown) in the apparatus. A continuous locus can be generated by approximation interpolation of the rotation correction amounts of the respective fields and the ejection operation can be continuously performed while performing the rotation correction. According to the position correction, the ejection pattern information may also be corrected.

On the other hand, a running error may occur also in the y-direction of constant speed movement. The running error in the y-direction similarly affects the ejection position accuracy. Further, there may be a need to change an ejection interval for each field in addition to the error correction. In this case, if the speed is changed for each field, a settling time becomes necessary. Thus, like the step movement in the x-direction, in the case of continuous ejection to adjacent fields, the speed cannot be changed between the adjacent fields.

The running error in the y-direction of constant speed movement can be said to be a speed error of the substrate stage 8. The speed error of the substrate stage 8 means a change in ejection interval (ejection magnification) in the y-direction, or the stage moving direction. Accordingly, the ejection interval error can be corrected by adjusting an ejection frequency of periodic ejection controlled by the nozzle array control units CNTa to CNTd of the respective nozzles shown in FIG. 6. The ejection frequency can be switched electrically and instantly without the movement of an object such as the substrate stage 8. That is, since the ejection frequency can be instantly switched per field, the ejection frequency can be variable between the fields. As a result, the ejection interval error can be easily corrected.

As described above, according to the present embodiment, control is performed such that running errors of the substrate stage 8 are corrected. Therefore, in the case of continuous ejection to adjacent fields, the ejection position accuracy can be ensured by performing continuous ejection while correcting the errors.

Third Embodiment

In the first and second embodiments, the substrate 6 in which fields are arrayed in a grid pattern is used for example. In other words, adjacent fields do not overlap each other in the stage moving direction. In the present embodiment, the description will be given of an example in which adjacent fields overlap each other in the stage moving direction.

Figure 9A:
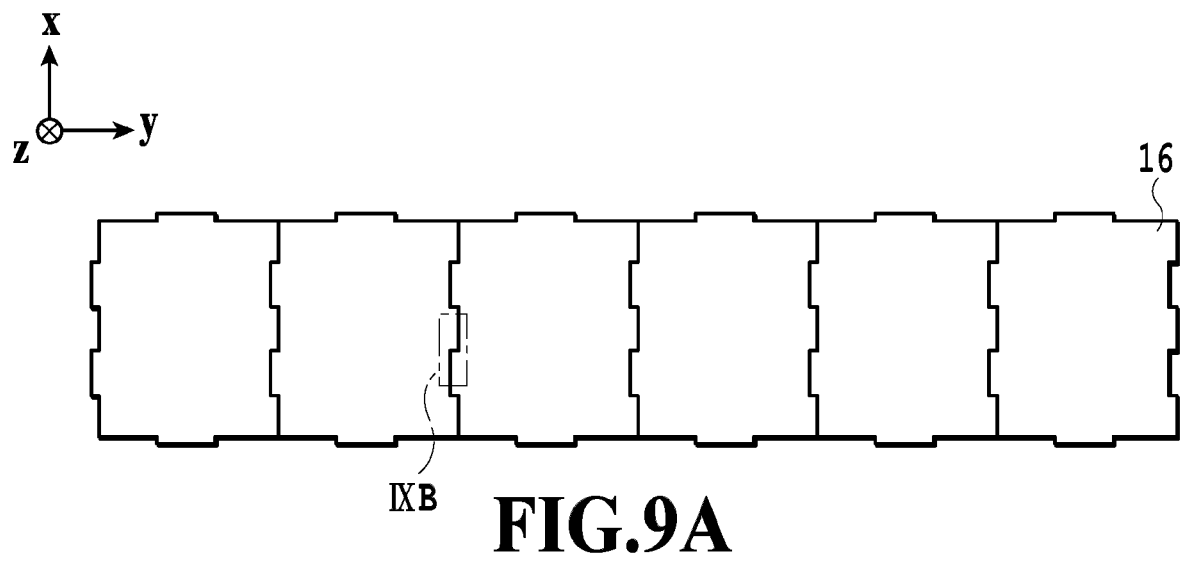
FIGS. 9A and 9B are diagrams showing a layout in which adjacent fields overlap each other.
Figure 9B:
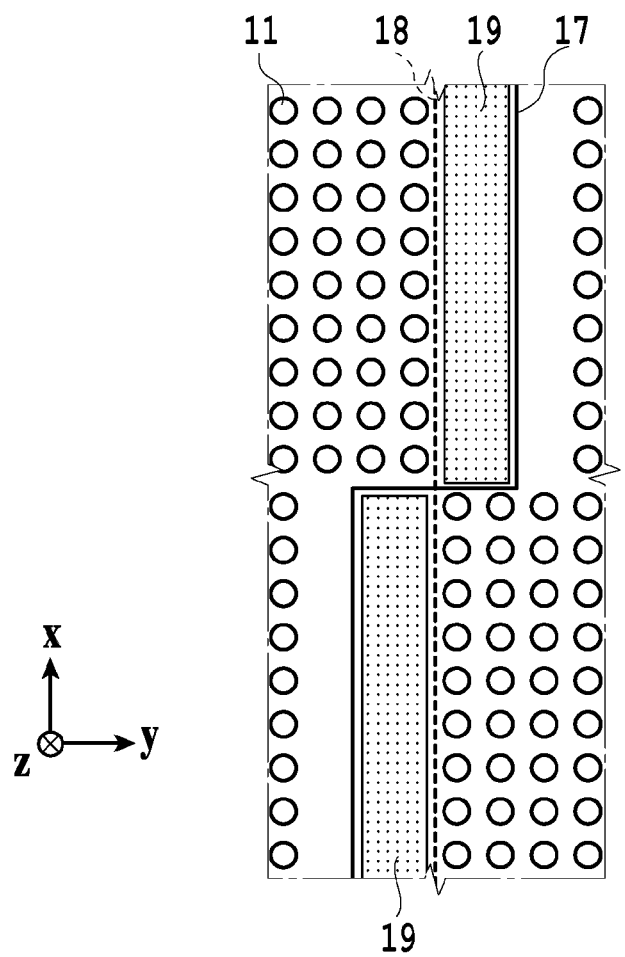

FIGS. 9A and 9B are diagrams showing a layout in which adjacent fields overlap each other in the stage moving direction (y-direction). A semiconductor process not limited to nanoimprint may use fields 16 shaped like a jigsaw puzzle as shown in FIG. 9A. In the case of such fields 16, a pattern area (such as a memory cell portion) can be effectively secured by arranging an alignment mark or the like (not shown) in an overlapping area. In a case where ejection areas are determined according to the shape of the fields 16 in such a layout, the ejection areas of adjacent fields partly overlap each other in the stage moving direction. In the overlapping area, two types of ejection patterns are mixed. The same nozzle array cannot be controlled at different ejection frequencies or different ejection timings at the same time. Thus, in the present embodiment, a restriction is provided such that the ejection areas do not overlap each other.

FIG. 9B is an enlarged view of the overlapping portion in FIG. 9A. An interval 17 between adjacent fields 16 is several micrometers. As shown in FIG. 9B, the fields 16 in which imprint areas overlap each other are provided with a restriction 18 inside the imprint areas such that the ejection areas do not overlap each other. The control unit 12 generates an ejection pattern of each field so as not to extend beyond the boundary of the restriction 18. In the case of providing the restriction, ejection impossible areas 19 are generated. For example, the upper area 19 in FIG. 9B is included in the imprint area of the left field 16 in the drawing but is excluded from the ejection area. Similarly, the lower area 19 in FIG. 9B is included in the imprint area of the right field 16 in the drawing but is excluded from the ejection area. On the periphery of the imprint area, the ejection material 11 is provided inside the imprint area in order to prevent bleeding of the ejection material 11 to the outside of the imprint area. Thus, the ejection material 11 is not provided in the ejection impossible areas 19. Therefore, the generation of the areas 19 does not produce any problem. The ejection pattern information is generated under the restriction 18 and input to the ejection control unit 21.

As described above, according to the present embodiment, since a restriction is imposed on ejection areas such that the ejection areas do not overlap each other, continuous ejection operation can be performed for adjacent fields even in an overlapping imprint layout.

Other Embodiments

In the embodiments described above, the nozzle array width is greater than the length between adjacent fields. However, the present invention is not limited to this example. The control described in the embodiments may be performed also in a case where the nozzle array width is equal to or less than the length between adjacent fields.

Although the first to third embodiments have been described separately, the embodiments may be combined with one another.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-204776, filed Nov. 12, 2019, which is hereby incorporated by reference wherein in its entirety.

What is claimed is:

1. An imprint apparatus comprising:
an ejection device configured to eject an ejection material by a plurality of nozzle arrays, the plurality of nozzle arrays including a first nozzle array and a second nozzle array away from the first nozzle array in a first direction;
a moving mechanism configured to perform relative movement of a substrate and the ejection device;
a control unit configured to cause the ejection device to eject the ejection material to a plurality of fields to be imprinted by a mold while causing the moving mechanism to perform the relative movement in the first direction; and
a timing control unit configured to determine an ejection start timing of each nozzle array with respect to each field in the plurality of nozzle arrays, each nozzle array ejecting, as an ejection operation, an ejection material a designated number of times to a field after the ejection start timing,
wherein in a case where the ejection device ejects the ejection material to a second field adjacent to a first field in the first direction in succession to an ejection to the first field, before the ejection operation of the second nozzle array for the first field is completed and after the timing control unit receives an ejection start signal for the second field, the timing control unit determines the ejection start timing of the first nozzle array in the second field.

2. The imprint apparatus according to claim 1, wherein an interval between the first field and the second field is less than a width of the plurality of nozzle arrays.

3. The imprint apparatus according to claim 1, wherein the ejection device comprises:
nozzle array control units provided for respective nozzle arrays of the plurality of nozzle arrays and configured to control ejection in the respective nozzle arrays,
wherein the timing control unit is configured to command the nozzle array control units to start ejection at ejection start timings.

4. The imprint apparatus according to claim 3, wherein each of the nozzle array control units drives nozzles of a corresponding nozzle array according to information indicating an ejection pattern in the field.

5. The imprint apparatus according to claim 1, wherein the timing control unit accepts the ejection start signal from the moving mechanism.

6. The imprint apparatus according to claim 3, wherein the nozzle array control units are separate from the timing control unit and do not accept the ejection start signal.

7. The imprint apparatus according to claim 1, wherein nozzles in each nozzle array are provided in positions not overlapping nozzles of other nozzle arrays in a second direction orthogonal to the first direction.

8. The imprint apparatus according to claim 1, wherein the moving mechanism relatively moves the substrate and the ejection device further in a second direction intersecting with the first direction and a rotation direction, and the control unit moves the moving mechanism according to a drive locus obtained by interpolation of correction amounts for correcting an error of relative positions of the substrate and the ejection device in the second direction and the rotation direction.

9. The imprint apparatus according to claim 1, wherein a moving speed of the moving mechanism is constant and an ejection frequency of the ejection material is variable per field.

10. The imprint apparatus according to claim 1, wherein in a case where the first field and the second field are shaped to overlap each other in the first direction, ejection areas of the first field and the second field are restricted such that the ejection areas do not overlap each other in the first direction.

11. The imprint apparatus according to claim 10, wherein the ejection device performs ejection according to information indicating an ejection pattern generated within a range of the restricted ejection areas.

12. The imprint apparatus according to claim 1, wherein after the ejection material is ejected to fields corresponding to one line including adjacent fields in the first direction, an imprint operation is performed for the fields corresponding to one line.

13. The imprint apparatus according to claim 1, further comprising a mold driving mechanism configured to press the mold against the fields on the substrate to which the ejection material has been ejected.

14. The imprint apparatus according to claim 1, wherein when the first nozzle array starts ejection of the ejection material to the second field, the second nozzle array ejects the ejection material to the first field.

15. The imprint apparatus according to claim 1, wherein the timing control unit determines the ejection start timing of the second nozzle array after the timing control unit receives the ejection start signal for the second field.

* * * * *